(12) United States Patent
Ouye

(10) Patent No.: US 6,598,316 B2
(45) Date of Patent: Jul. 29, 2003

(54) APPARATUS TO REDUCE CONTAMINANTS FROM SEMICONDUCTOR WAFERS

(75) Inventor: Alan Hiroshi Ouye, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/139,062

(22) Filed: May 2, 2002

(65) Prior Publication Data

US 2002/0124428 A1 Sep. 12, 2002

Related U.S. Application Data

(62) Division of application No. 09/366,175, filed on Aug. 3, 1999, now Pat. No. 6,406,553.

(51) Int. Cl.[7] ............................................. F26B 21/00
(52) U.S. Cl. ............................. 34/565; 34/558; 34/559; 134/21
(58) Field of Search ............................. 34/541, 558, 559, 34/565, 79, 218, 231, 232; 134/21, 37; 15/301

(56) References Cited

U.S. PATENT DOCUMENTS 5,536,330 A * 7/1996 Chen et al. ................... 134/21
5,858,108 A    1/1999 Hwang ......................... 134/1.3
5,888,579 A * 3/1999 Lun ................................ 427/8
6,306,778 B1 * 10/2001 Sakai ........................... 438/782
6,322,631 B1 * 11/2001 Okase .......................... 118/708

FOREIGN PATENT DOCUMENTS

JP            07-227534          6/1994

* cited by examiner

Primary Examiner—Pamela A Wilson
(74) Attorney, Agent, or Firm—Moser Paterson & Sheridan, LLP

(57) ABSTRACT

A line for processing semiconductor wafers into integrated circuits (ICs) is provided with an input-output (I-O) chamber to help purge residual contamination from the wafers before they are transferred into a processing line. After a cassette containing semiconductor wafers is placed in the chamber, it is sealed from the line and from the atmosphere. Then a dry inert gas such as nitrogen is dispersed into the top of the chamber to form a covering blanket around the wafers to displace and sweep away contaminants such as air-borne particles, moisture and organic vapors. While the purge gas is flowing, gasses and residual contamination are exhausted from the bottom of the chamber at a relatively slow rate until an intermediate pressure level is reached at which pressure droplets of liquid from residual moisture and vapor can no longer condense. Then the flow of purge gas is stopped and the pressure within the chamber is relatively quickly reduced to a base operating value (e.g., a fraction of a Torr), after which the wafers can be transferred to the line for processing into ICs.

18 Claims, 2 Drawing Sheets

APPARATUS TO REDUCE CONTAMINANTS FROM SEMICONDUCTOR WAFERS

CROSS-REFERENCE TO RELATED APPLICATIONS

This application is a divisional of U.S. patent application Ser. No. 09/366,175 filed on Aug. 3, 1999 now U.S. Pat. No. 6,406,553 B1. The related patent application is herein incorporated by reference.

FIELD OF THE INVENTION

This invention relates to method and apparatus for purging and cleansing of contaminants such as air-borne particles, moisture, etc, from semiconductor wafers prior to their being fabricated into integrated circuits.

BACKGROUND OF THE INVENTION

Present day integrated circuits (ICs) may have many millions of devices (e.g., memory cells) per square centimeter of chip area. The devices themselves may have line widths and other surface dimensions considerably smaller than a micron (micrometer). As a consequence cleanliness and freedom from contamination of the ICs before and between the various processing steps during their manufacture is now more important than ever before.

It has long been known that dust, smoke, and similar air-borne particles (some too small to see with the unaided eye), and contaminants such as moisture and organic vapors are very harmful to ICs during manufacturing. Accordingly, semiconductor manufacturing plants have elaborate air filtering systems and are as clean if not cleaner than surgical operating rooms. The operators and technicians who run a semiconductor manufacturing plant are required to wear elaborate clean-room garb including face masks and in some cases self-contained breathing units. Even so contamination of semiconductor wafers continues to be a problem, particularly before or between processing steps where the semiconductor wafers are handled by human operators in the course of moving the wafers from one piece of equipment to another. This is especially true where IC device density is so great and device size so small. The present invention is intended to help further eliminate contamination of semiconductor wafers during their manufacture into ICs.

SUMMARY OF THE INVENTION

In accordance with the invention in one aspect thereof, semiconductor processing equipment is provided with an input-output (I-O) chamber which may be hermetically sealed from the remainder of the equipment whenever desired. The I-O chamber is easily opened to permit an operator to insert a cassette or cassettes containing semiconductor wafers for processing at a station or stations provided by the equipment. After a cassette containing semiconductor wafers has been placed in the I-O chamber, it is closed and hermetically sealed and the following sequence of events in accordance with the invention are carried out. A dry, inert purge gas, such as nitrogen, is flowed into the chamber near the top thereof through a diffuser in close proximity to the cassette and semiconductor wafers. The gas forms a covering blanket blowing over and around the wafers and helps eliminate residual contamination which may be present. The purge gas with any trapped contaminants is exhausted during an initial phase at a relatively slow rate down and out of the chamber. During this initial gas flow and slow pump-down of gas pressure, contaminants such as minute particles, moisture (e.g., from atmospheric humidity), residual organic vapor (e.g., from a previous processing step), etc. are swept off of and down away from the wafers. While gas is still being admitted into the chamber, gas pressure is reduced within the chamber to a pre-determined intermediate value below which pressure remaining atmospheric moisture within the chamber will no longer condense on the wafers. When this intermediate pressure is reached (e.g., typically in about 1 minute) the incoming gas is turned off and the pressure within the chamber is then rapidly reduced to a vacuum base pressure (e.g., a fraction of a Torr). As soon as vacuum base pressure is reached (e.g., after about 2 minutes or less of fast-pump gas exhaust) the I-O chamber may be opened to the remainder of the equipment to permit processing of the semiconductor wafers.

In accordance with another aspect of the invention there is provided a method to help purge residual contamination from semiconductor wafers during their manufacture into integrated circuits (ICs). The method comprises the steps of placing one or more wafers in an input-output (I-O) chamber; sealing the chamber; flowing a dry inert purge gas into the chamber in close proximity to the wafers to form a covering blanket of purge gas flowing over and around the wafers to help eliminate contaminants from the wafers; exhausting the purge gas and residual contamination away from the wafers and out of the chamber; relatively slowly reducing the pressure within the chamber to an intermediate pressure level; and thereafter relatively rapidly reducing the gas pressure within the chamber to a low base value to permit the wafers to go through a step or steps of processing into ICs.

In accordance with yet another aspect of the invention there is provided apparatus for helping in processing semiconductor wafers into integrated circuits (ICs) in a processing line.

The apparatus comprises an input-output (I-O) chamber adjacent the processing line for helping eliminate contamination of the wafers before they are processed in the line, the I-O chamber being hermetically sealable from the processing line so that the chamber can be opened to the atmosphere and thereafter closed to permit semiconductor wafer to be placed into the chamber for subsequent processing; a gas supply for supplying dry, inert gas to form a gas blanket over and around the wafers to help purge them of contaminants such as minute foreign particles, atmospheric moisture, and residual organic vapors; and a pump for pumping the purge gas, residual moisture and purged contaminants away from the wafers, the pump being controlled during an initial period to relatively slowly exhaust purge gas and contaminants and reduce the pressure within the chamber to an intermediate level, the gas supply being turned off when the intermediate pressure level is reached, and thereafter the pump relatively rapidly exhausting the gas in the chamber to a base level at which pressure the I-O chamber can be opened to the processing line for processing of the wafers therein.

Viewed from a first apparatus aspect, the present invention is directed to apparatus comprising an input-output (I-O) chamber, a gas supply line, and a pump. The input-output (I-O) chamber I-O chamber is hermetically sealable so that the chamber can be opened to the atmosphere and thereafter closed. The gas supply line supplies dry, inert gas to form a gas blanket over and around at least one semiconductor wafer in the chamber to remove therefrom contaminants such as minute foreign particles, atmospheric moisture, and residual organic vapors. The pump pumps the purge gas, and any residual moisture and purged contaminants away from the at least one semiconductor wafer. The pump is controlled during an initial period to relatively slowly exhaust purge gas and contaminants and reduce the pressure within the chamber to an intermediate pressure level. A gas supplied to the gas supply line is turned off when the intermediate pressure level is reached. Thereafter the pump relatively rapidly exhausting the gas in the chamber to a lower base pressure level.

Viewed from a second apparatus aspect, the present invention is directed to apparatus for processing semiconductor wafers into integrated circuits (ICs). The apparatus comprises a processing line, an input-output (I-O) chamber, a gas supply line for supplying dry inert purge gas to the chamber, a diffuser in the chamber, a pump, and control circuitry. The input-output (I-O) chamber is adjacent the processing line for reducing contamination of the semiconductor wafers before they are processed in the line and is hermetically sealable from the line so that the chamber can be opened to the atmosphere to permit placement into the chamber of semiconductor wafers to be processed in the line. The diffuser disperses the purge gas as a blanket over and around the semiconductor wafers to help purge them of contaminants such as minute foreign particles, atmospheric moisture, and organic vapors. The pump pumps the purge gas and residual contaminants away from the semiconductor wafers. The control circuitry turns on a gas supply coupled to the gas supply line and puts the pump into a slow-pump mode during an initial period, and turns off a gas supplied to the gas supply line and puts the pump into a fast-.pump mode during a second time period, such that at the end of the second time period the semiconductor wafers are prepared for transfer to the processing line.

Viewed from a third apparatus aspect, the present invention is directed to apparatus comprising an input-output (I-O) chamber, gas supply means, and pump means. The input-output (I-O) chamber receives at least one semiconductor wafer. The chamber is hermetically sealable so that the chamber can be opened to the atmosphere and thereafter closed. The gas supply means supplies purge gas to form a gas blanket over and around the at least one semiconductor wafer to remove therefrom contaminants such as minute foreign particles, atmospheric moisture, and residual organic vapors. The pump means pumps the purge gas and any residual moisture and purged contaminants away from the at least one semiconductor wafer. The pump means is controlled during an initial period to relatively slowly exhaust purge gas and contaminants and reduce the pressure within the chamber to an intermediate pressure level, the gas supply means being turned off when the intermediate pressure level is reached, and thereafter the pump means relatively rapidly exhausting the gas in the chamber to a lower base pressure level.

Viewed from a first method aspect, the present invention is directed to a method of removing contamination from a semiconductor wafer. The method comprises the steps of: placing at least one semiconductor wafer in an input-output (I-O) chamber; sealing the chamber; flowing a dry inert purge gas into the chamber in close proximity to the semiconductor wafer to form a covering blanket of purge gas flowing over and around the semiconductor wafer to reduce contaminants from the semiconductor wafer; exhausting the purge gas and residual contamination away from the semiconductor wafer and out of the chamber; relatively slowly reducing the pressure within the chamber to an intermediate pressure level; and thereafter relatively rapidly reducing the gas pressure within the chamber from the intermediate pressure value to a lower base pressure level.

Viewed from a second method aspect, the present invention is directed to a method for reducing contamination from semiconductor wafers prior to their processing into integrated circuits (ICs) in a processing line. The method comprises the steps of: placing the semiconductor wafers in an hermetically sealable input-output (I-O) chamber for subsequent transfer into the processing line; sealing the chamber from the line and the outside atmosphere; flowing a dry inert purge gas into the chamber in close proximity to the semiconductor wafers to quickly form a covering blanket of purge gas flowing over and around the semiconductor wafers to help remove contaminants therefrom; exhausting the purge gas and residual contamination away from the semiconductor wafers and down and out of the chamber while relatively slowly reducing the pressure within the chamber to an intermediate pressure level at which droplets of liquid cannot form and while the purge gas is still flowing; stopping the inflow of purge gas when the intermediate pressure level is reached; and thereafter relatively rapidly reducing the pressure within the chamber to a low base pressure level to permit the semiconductor wafers to be transferred to the line in which same can be processed into ICs.

A better understanding of the invention together with a fuller appreciation of its many advantages will best be gained from a study of the following description given in conjunction with the accompanying claims and drawings.

DETAILED DESCRIPTION

Figure 1:
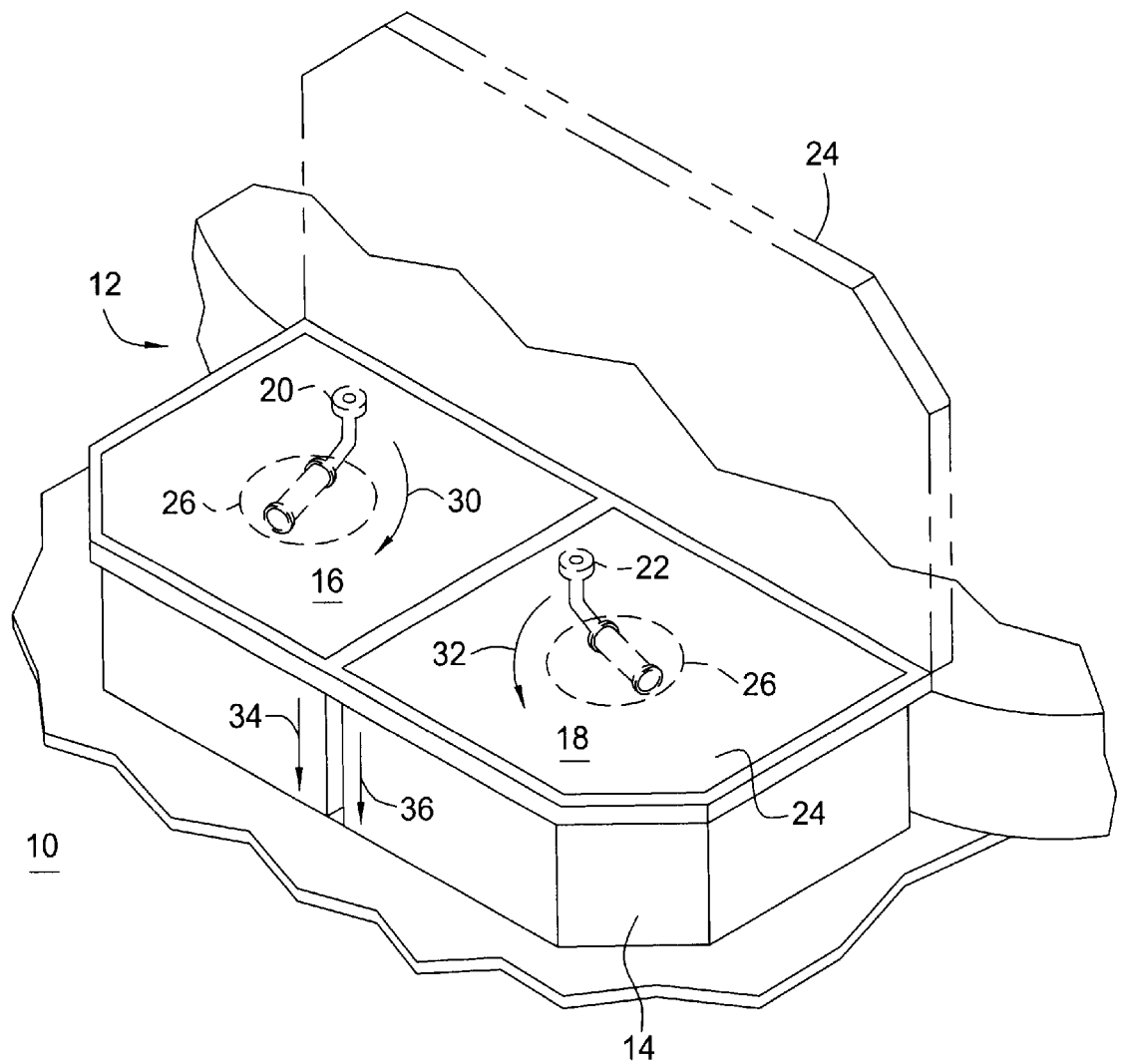
FIG. 1 is a schematic view partially broken away of apparatus for processing semiconductor wafers into integrated circuits, the apparatus including an input-output (I-O) chamber provided in accordance with the present invention.

Referring now to FIG. 1, there is shown an apparatus 10 partially broken away and in schematic form, which comprises an automated semiconductor processing line, generally indicated at 12, and an input-output (I-O) chamber 14 provided in accordance with the present invention. The processing line 12 can be of a type well known in the art and will not be further described herein.

The I-O chamber 14 has, by way of illustration, dual cavities 16 and 18 (which may be mirror images of each other), dual gas diffusers 20 and 22, which may be identical and which are supplied with a controlled flow of dry inert gas, such as nitrogen, as will be explained in detail in connection with FIG. 2. As seen in FIG. 1, the chamber 14 has a lid 24 which may be raised as shown in dashed outline to permit an operator to place in position in the chamber one or more cassettes 26 containing semiconductor wafers for processing into integrated circuits (ICs) at a station or stations (not shown) in the line 12.

Before being placed into the chamber 14, the cassettes 26 holding the semiconductor wafers (not separately shown) are exposed to the ambient atmosphere pressure and temperature and may contain some moisture and air-borne particles remaining in the air even after careful filtering. The wafers themselves may also contain residual contaminants, such as organic vapor remaining from a previous processing step (e.g., photo-masking). Such organic and water vapors, if allowed to condense on the semiconductor wafers can cause serious defects in the ICs subsequently produced. The present invention provides a highly effective system to help prevent this.

The I-O chamber 14 can be hermetically sealed from the line 12, and from the outside atmosphere. When the lid 24 is closed (solid line position) after the cassettes 26 (and their wafers) have been placed in the chamber 14, dry, inert purge gas (e.g., nitrogen) is introduced into the chamber 14 at a controlled rate. This purge gas flows through the diffusers 20 and 22 over and around the cassettes 26, as indicated by the respective circular arrows 30 and 32, to quickly blanket the cassettes 26 (and wafers) and sweep away contaminants. As purge gas flows into the chamber 14, the purge gas displaces atmospheric air. At the same time, the purge gas, displaced air, and entrapped contaminants are exhausted during a brief initial period at a controlled, relatively slow rate from the bottom of the chamber 14, as indicated by the arrows 34 and 36. The rate of exhaust along with the inflow of purge gas are controlled so as not to reduce too quickly the pressure within the chamber 14 and thereby cause unwanted condensation of vapor which may still be present into droplets of liquid. Yet the rate is fast enough that the dry purge gas very quickly blankets and completely surrounds the wafers in the cassettes 26.

The cassettes 26 and wafers are advantageously located within the cavities 16 and 18 closely adjacent the respective diffusers 20 and 22 near the top of the chamber 14. Thus the downward pull of gravity will aid the purge gas in removing contaminants from the wafers and from the chamber 14.

Figure 2:
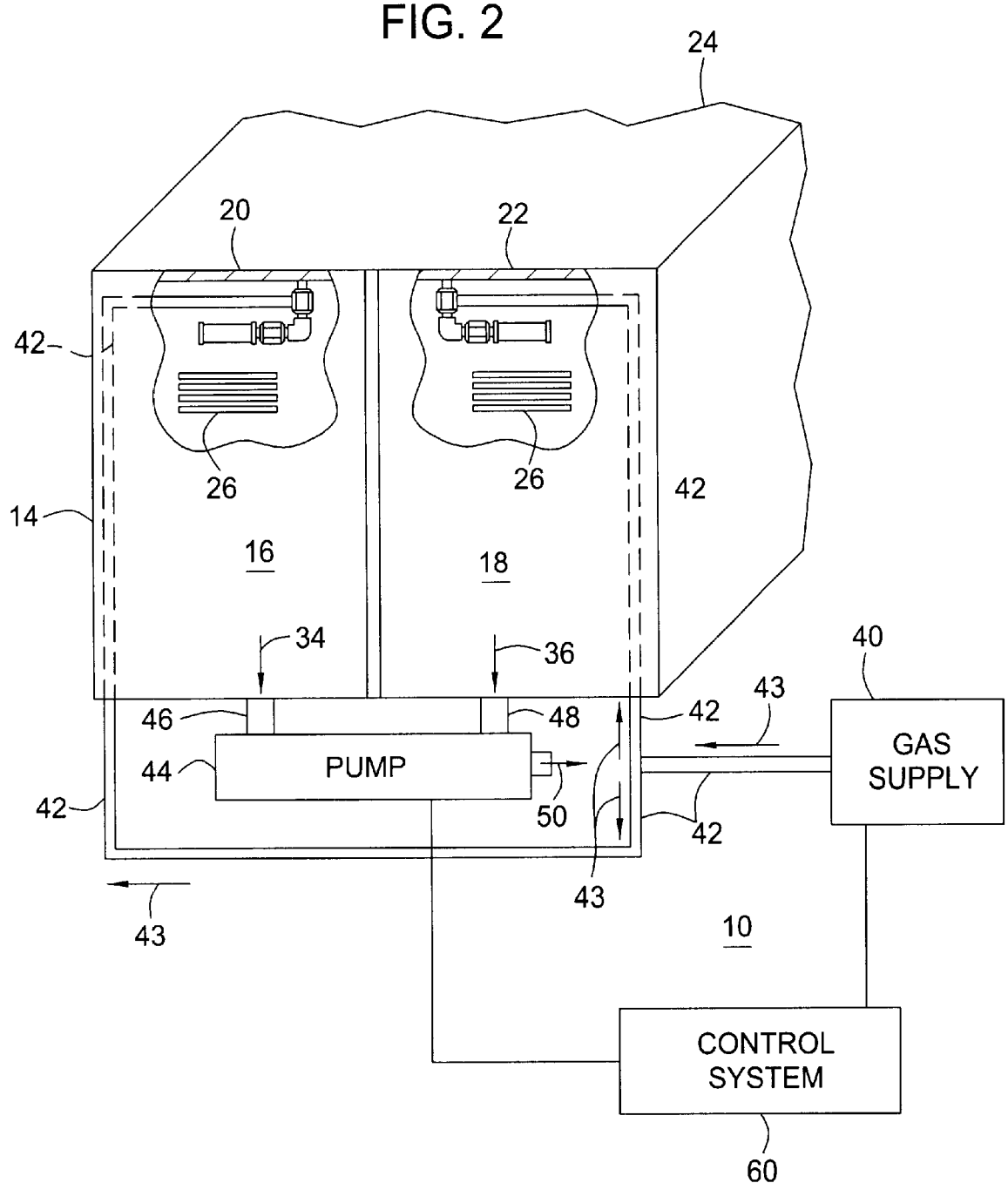
FIG. 2 is a schematic view of the front portion of the apparatus of FIG. 1 and of the (I-O) chamber with its associated gas supply and pump provided in accordance with the present invention.

Referring now to FIG. 2, there is shown a schematic front view of the apparatus 10, with portions broken away. Shown in FIG. 2 are the I-O chamber 14, the cavities 16 and 18, the lid 24 (shown closed) the respective diffusers 20 and 22, the cassettes 26 (containing semiconductor wafers awaiting processing), a gas supply 40, gas supply lines 42, a pump 44, and respective exhaust pipes 46 and 48 leading from the bottom of the cavities 16 and 18 to the pump 44.

As was mentioned previously, after the cassettes 26 (and wafers) are placed in the chamber 14, the lid 24 is closed to hermetically seal the chamber 14. Then the gas supply 40 is turned on and the pump 44 is put into an initial slow-pump mode. Simultaneously, purge gas flows via the supply lines 42 (as indicated by arrows 43) through the respective diffusers 20 and 22 and quickly blankets the cassettes 26 (and their wafers) and displaces atmospheric air in the chamber 14, while displaced air and contaminants are being exhausted by the pump 44 via the pipes 46 and 48 from the bottom of the respective cavities 16 and 18 of the chamber 14. Gas is exhausted elsewhere (as indicated by an arrow 50) relatively slowly in this initial phase so that pressure within the chamber is gradually reduced from normal atmospheric pressure to a lower value (level), an intermediate value, to insure that droplets of liquid (e.g., from airborne moisture or organic vapor) can no longer form and condense on the wafers. When this intermediate pressure (value) is reached (e.g., typically in about 1 minute), the gas supply 40 is turned off and the pump 44 is put into fast-pump mode to quickly reduce the pressure within the chamber 14 to a still lower level (value), a base value, at which the wafers can be processed into ICs. This lower or base value is typically a fraction of a Torr. When the base pressure level is reached (e.g., after about 2 minutes or less of fast-pump gas exhaust), the pump 44 is turned off, the seal between the I-O chamber 14 and the processing line 12 opened, and the semiconductor wafers transferred into the line 12 for processing into ICs. A control system 60 having circuits for controlling the gas supply 40 and the pump 44, which circuits are computer controllable and automatically operated, is included. Suitable ones of such circuits and their operation are well known in the art. After processing in the line 12, the wafers are returned to the I-O chamber 14, the seal to the line 12 closed, I-O chamber 14 opened, and the cassettes 26 (with processed wafers) removed and replaced with other cassettes 26 and wafers awaiting processing.

The above description is intended in illustration and not in limitation of the invention. Various changes and modifications in the method and apparatus disclosed may occur to those skilled in the art and can be made without departing from the spirit or scope of the invention as described herein and set forth in the accompanying claims. For example, purge gas other than nitrogen may be employed, and the chamber pressure, purge gas flow rate, slow and fast pump mode rates, and times may be adjusted to suit the needs of a particular IC processing line. Still further, the I-O chamber may have only one cavity, and is not limited to use with any particular process line. Furthermore, the semiconductor wafers may be transferred or supported by any suitable means other than cassettes.

What is claimed is:

1. An apparatus, comprising:
   an input-output (I-O) chamber being hermetically sealable and having a cover operable to open and close the chamber to the atmosphere;
   a gas supply line adapted to supply at least one dry, inert gas to form a gas blanket over and around at least one semiconductor wafer in the chamber to remove therefrom contaminants selected from the group consisting of minute foreign particles, atmospheric moisture, and residual organic vapors;
   a pump for pumping the gas and purging the contaminants away from the at least one semiconductor wafer; and
   a control system for controlling the gas supply line and the pump,
      the pump being controlled during an initial period to exhaust the gas and contaminants at a first rate and reduce pressure within the chamber from a first pressure level to a second pressure level lower than the first pressure level,
      the gas being supplied to the gas supply line during the initial period,
      the gas supply line being turned off when the second pressure level is reached, and thereafter
      the pump at a second rate exhausting the gas in the chamber to a third pressure level lower than the second pressure level.

2. The apparatus of claim 1, wherein the initial period is about one minute.

3. The apparatus of claim 1, wherein the first rate is slower than the second rate.

4. The apparatus of claim 1, wherein the second pressure level is a pressure level where droplets of liquid from remaining moisture or vapor can no longer condense.

5. The apparatus of claim 1, wherein the base pressure level is less than about 1 Torr.

6. The apparatus of claim 1, further comprising a processing line being positioned adjacent the I-O chamber.

7. The apparatus of claim 1, further comprising a diffuser for dispersing the at least one dry, inert gas.

8. An apparatus for processing semiconductor wafers into integrated circuits (ICs), comprising:
   a processing line;
   an input-output (I-O) chamber having a top and a bottom and being positioned adjacent the processing line for reducing contamination of the semiconductor wafers before they are processed in the processing line and the surrounding atmosphere, the I-O chamber being hermetically sealable from the processing line to be opened to the atmosphere to permit placing a semiconductor wafer into the I-O chamber and processing the semiconductor wafer in the processing line;

a gas supply line for supplying a dry inert purge gas to the I-O chamber;

a diffuser in the I-O chamber for dispersing the purge gas as a blanket over and around the semiconductor wafer to purge contaminants selected from the group consisting of minute foreign particles, atmospheric moisture, and organic vapors;

a pump for pumping the purge gas and contaminants away from the semiconductor wafers; and a control circuitry for turning on a gas supply coupled to the gas supply line and putting the pump into a slow-pump mode during an initial time period, and for putting the pump into a fast-pump mode during a second time period, whereby at the end of the second time period the semiconductor wafers are prepared for transfer to the processing line.

9. The apparatus of claim 8 wherein:

the diffuser is located near the top of the I-O chamber; and the pump exhausts purge gas and contaminants from the bottom of the chamber.

10. The apparatus of claim 8, wherein:

the control circuitry is computer controllable and automatically turns the purge gas off at the end of the initial time period when pressure within the chamber is reduced from a first pressure level to a second, lower pressure level, at which droplets of liquid from remaining moisture or vapor can no longer condense; and the control circuitry automatically turns the pump off at the end of the second period when a base pressure level lower than the second pressure level is reached and the processing line is opened to the I-O chamber.

11. The apparatus of claim 10, wherein:

the initial time period is about one minute;

the second time period is about 2 minutes; and the base pressure level is less than 1 Torr.

12. An apparatus, comprising:

an input-output (I-O) chamber for receiving at least one semiconductor wafer, the chamber being hermetically sealable and adapted to be opened to the atmosphere and thereafter closed;

a gas supply means for supplying a purge gas to form a gas blanket over and around the at least one semiconductor wafer to remove therefrom contaminants, selected from the group consisting of minute foreign particles, atmospheric moisture, and residual organic vapors; and pump means for pumping the purge gas and purging the contaminants away from the at least one semiconductor wafer, the pump means being controlled during an initial period to exhaust the purge gas and contaminants at a first rate and reduce pressure within the chamber from a first pressure level to a second pressure level lower than the first pressure level, the gas supply means being turned off when the second pressure level is reached, and thereafter the pump means exhausting the purge gas and the contaminants at a second rate faster than the first rate and reduce pressure in the chamber to a base pressure level lower than the second pressure level.

13. The apparatus of claim 12, further comprising:

computer-controllable circuit means for controlling the gas supply means and the pump means, wherein the computer-controllable circuit means turn the gas supply means off when pressure within the chamber reaches the second pressure level, at which droplets of liquid from remaining moisture or vapor can no longer condense; and the computer-controllable circuit means turn the pump means off when the base pressure level is reached.

14. An apparatus, comprising:

a hermetically sealable input-output (I-O) chamber adapted to be opened and closed to the atmosphere;

a gas supply line adapted to supply during an initial period at least one dry, inert gas at a first pressure level to form a gas blanket over and around at least one semiconductor wafer in the chamber and remove contaminants therefrom;

a pump in fluid communication with the interior of the chamber and adapted to pump the gas and contaminants away from the at least one semiconductor wafer; and a control system adapted to control the gas supply line and the pump, the pump being controlled during the initial period to exhaust the gas and contaminants and at a first rate to reduce the pressure in the chamber to a second, lower pressure level, the gas supply line being turned off when the second pressure level is reached, and thereafter the pump at a second rate exhausting the gas in the chamber to a lower, third pressure level.

15. The apparatus of claim 14, wherein the initial period is about one minute.

16. The apparatus of claim 14, wherein the first rate is slower than the second rate.

17. The apparatus of claim 14, wherein the second pressure level is a pressure level where droplets of liquid from remaining moisture or vapor can no longer condense.

18. The apparatus of claim 14, wherein the base pressure level is less than about 1 Torr.

* * * * *